United States Patent [19]

Matoba et al.

[11] Patent Number: 5,021,993

[45] Date of Patent: Jun. 4, 1991

[54] DEVICE FOR SAVING AND RESTORING REGISTER INFORMATION

[75] Inventors: Tsukasa Matoba, Kawasaki; Takeshi Aikawa; Mitsuyoshi Okamura, both of Tokyo; Ken-ichi Maeda, Kamakura; Mitsuo Saito, Yokosuka, all of Japan

[73] Assignee: Kabushiki Kaisha Toshiba, Kawasaki, Japan

[21] Appl. No.: 175,224

[22] Filed: Mar. 30, 1988

[30] Foreign Application Priority Data

Mar. 31, 1987 [JP] Japan ................................ 62-78506

[51] Int. Cl.$^5$ .............................................. G06F 9/00
[52] U.S. Cl. .................................... 364/900; 364/933; 364/933.7; 364/933.3; 364/926.1; 364/926.2
[58] Field of Search ... 364/200 MS File, 900 MS File

[56] References Cited

U.S. PATENT DOCUMENTS

| | | | |
|---|---|---|---|
| 3,905,025 | 9/1975 | Davis et al. | 364/200 |
| 4,181,938 | 1/1980 | Suzuki et al. | 364/200 |
| 4,287,560 | 9/1981 | Forbes et al. | 364/200 |
| 4,394,763 | 7/1983 | Nagano et al. | 364/900 |
| 4,404,647 | 9/1983 | Jones et al. | 364/900 |
| 4,410,939 | 10/1983 | Kawakami | 364/200 |
| 4,434,461 | 2/1984 | Puhl | 364/200 |

FOREIGN PATENT DOCUMENTS 8302016 of 0000 PCT Int'l Appl. .

Primary Examiner—Gareth D. Shaw
Assistant Examiner—Kevin A. Kriess
Attorney, Agent, or Firm—Oblon, Spivak, McClelland, Maier & Neustadt

[57] ABSTRACT

Each register of an internal register unit of a microprocessor has a pair of register cells consisting of first and second cells having the same register address. When one of these cells is selected, the other cell non-selected serves as a "back-up cell" for the selected cell. Each register of the register unit has a flag bit for storing a selector flag representing which cell of the pair of cells of the register is currently selected, and a flag bit for storing a change flag representing whether register information of the register is rewritten after a selected cell is changed between the first and second cells of the register. When the register information is stored in one of the pair of cells currently being selected of a certain register and is to be rewritten with another new information, the other cell of the register is selected to store the new information therein. The original register information is held in the first cell, thereby eliminating necessity of saving the original register information to a main memory at this stage. When the original register information is required again, the original register information can be rapidly restored, by only selecting the first cell again, in the corresponding register without executing save/restore processing between the register unit and the main memory.

17 Claims, 4 Drawing Sheets

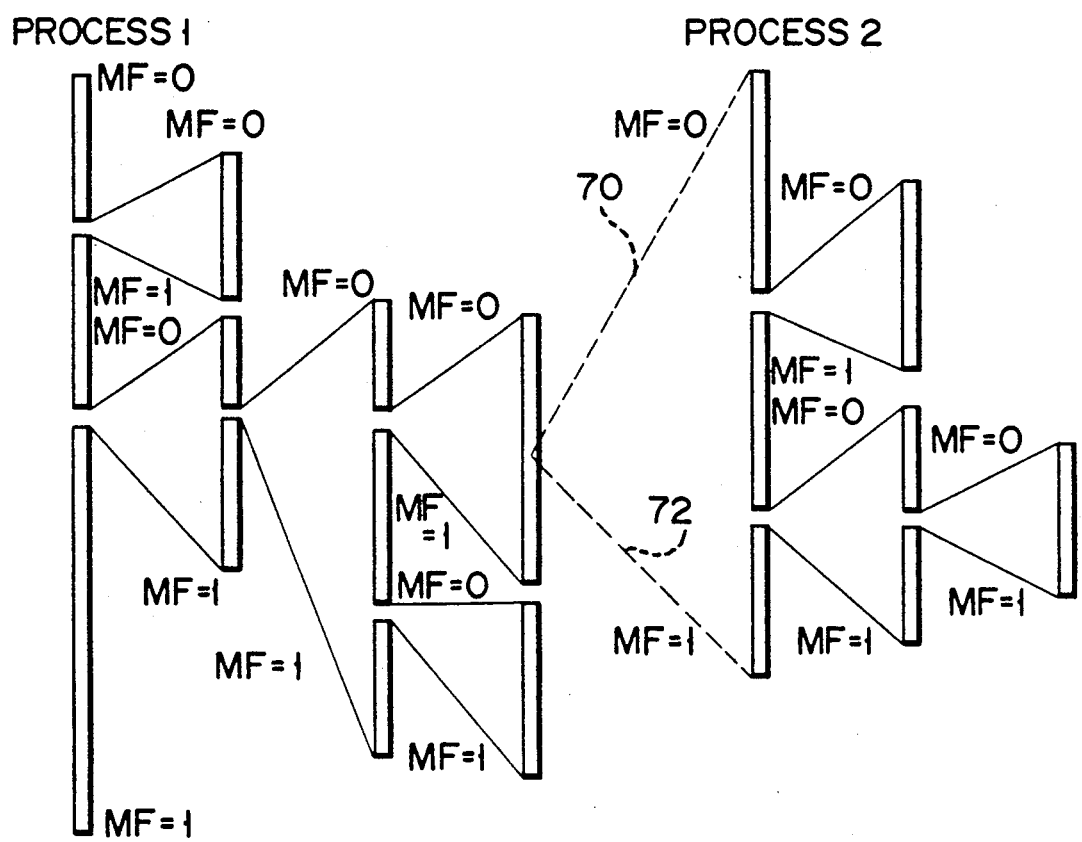
F I G. 2

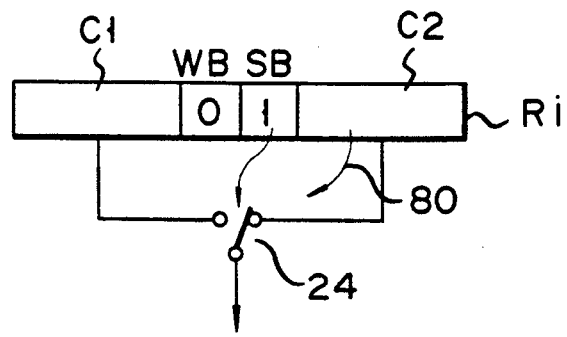
FIG. 3A
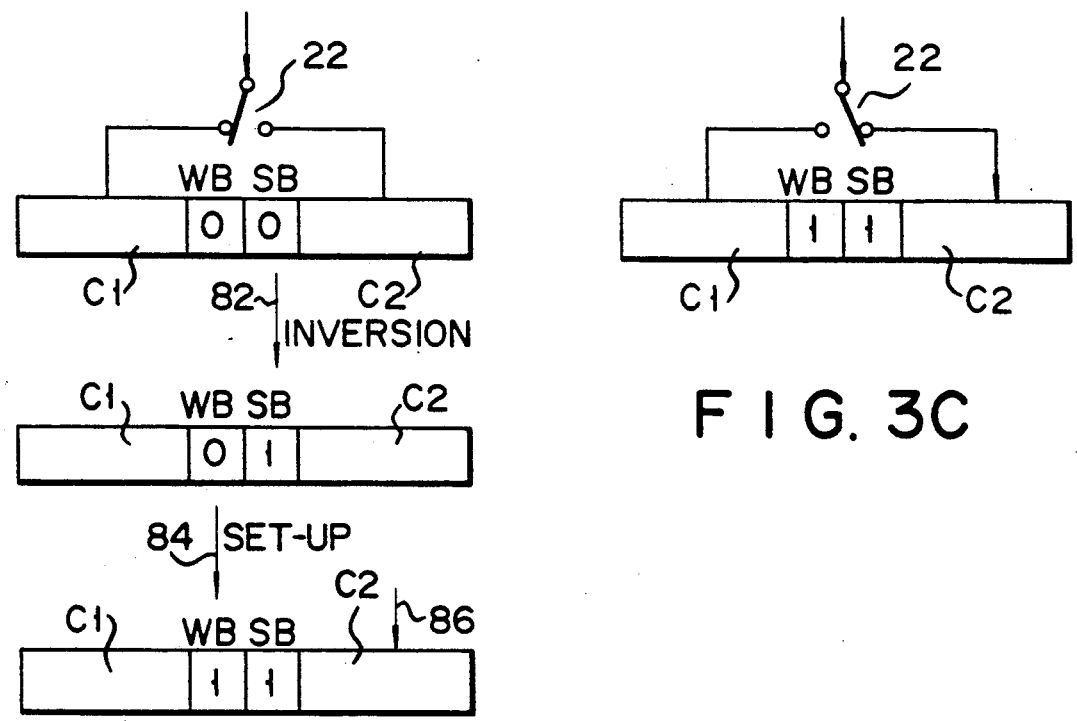
FIG. 3C
FIG. 3B

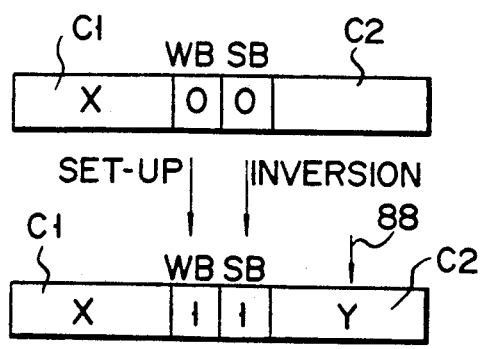
F I G. 4
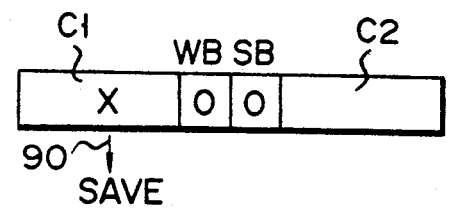
F I G. 5A
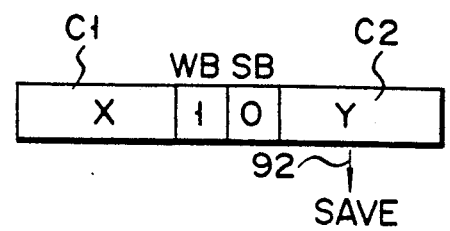
F I G. 5B
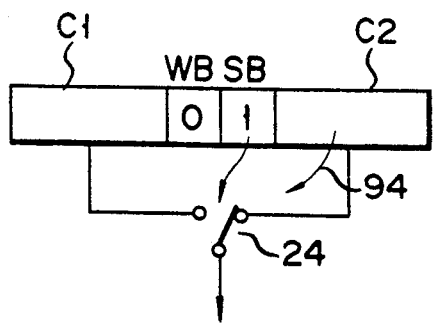
F I G. 6A
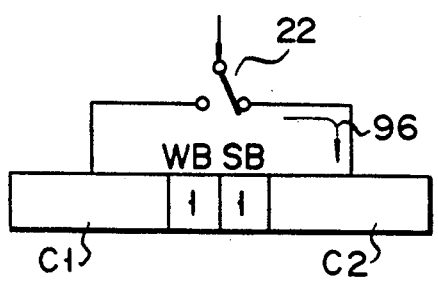
F I G. 6B
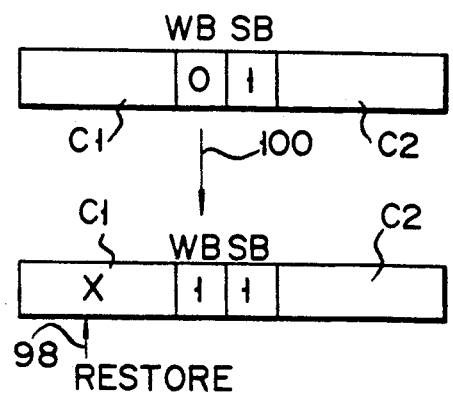
F I G. 7

DEVICE FOR SAVING AND RESTORING REGISTER INFORMATION

BACKGROUND OF THE INVENTION

1. Field of the Invention.

The present invention relates to a highly-integrated micro-processor and, more particularly, to a device for saving and restoring register information temporarily stored in a general-purpose register of a central-processing unit.

2. Description of the related art.

Recently, an architecture of high-performance micro-processors and high-integration fabrication technology thereof have been developed significantly. In particular, the processing capacity of micro-processors has been greatly improved to enable of advanced micro-processors which can provide an information processing environment suitable for a multi-task operating system. Among those micro-processors of this type a micro-processor is known which has, in its chip, instructions for the efficient internal execution of a specific multi-task operating system which enables a single machine to perform a plurality of different information processing (i.e., tasks) in a parallel manner. In the field of special-purpose machines, a micro-processor for a machine (called a "PROLOG machine") which is strongly linked to a "PROLOG", which is a typical one of computer languages suitable for programs for an artificial intelligence, has been widely developed.

In any of the above machines, register contents (e.g., control information, instructions, data and the like are also called as "register information" in this specification) in a micro-processor are frequently changed. For example, assume that a given task is performed on a multi-task operation system and at the same time another task must be performed in a parallel manner. In this case, stored contents of an internal register are changed such that register contents of a current register are saved to a main memory and necessary information are stored at empty register addresses of the register. When performance of the task is finished, the original information saved to the main memory are returned to the register, thereby restoring the register contents. According to the multi-task operation system, process-switching must be performed in units of predetermined time intervals of several milliseconds. Therefore, saving/restoring of processor information concerning the process currently being performed must be frequently and rapidly repeated between the register and the main memory in units of the above time intervals.

In the PROLOG machine, if a so-called "back step" in which a system environment is returned to a state one step before the current state is generated while a unification operation is being performed on an inference program system, all the information concerning the environment up to a closest branch point (called as a "choice point") among a plurality of choice points passed so far must be restored in a register. For this purpose, a large amount of information are transferred between the main memory and the internal register.

In a microscopic view point, when instructions such as a "subroutine call" or "return" included in software programs are to be performed while a given task is being performed, current register contents must be rewritten. In this case, again, current information stored in the register are saved to the main memory, and information required for performing the above instructions are written in the register.

According to current micro-processors, a frequency of saving/restoring of the register contents is significantly increased. Therefore, if the conventional register save/restore technique is adopted, an operation speed of the micro-processor is reduced. The reason for this is as follows. That is, according to the conventional register save/restore technique, each time saving/restoring is to be performed, managements for controlling each section must be performed to execute data accessing in the internal register and the main memory and data transfer therebetween. Therefore, as a time required for managements is increased, a time of a stand-by state for information processing is increased.

Conventionally, in consideration of the above situation, an improved micro-processor has been developed so that a save/restore step of all the register contents in the micro-processor can be performed by only a single instruction. However, according to such a software improvement, although a time required for fetching the instruction in a central processing unit can be reduced, a time required for actually transferring data between the register and the main memory cannot be reduced at all.

SUMMARY OF THE INVENTION

It is therefore an object of the present invention to provide a new and improved device for saving and restoring register information in which information transfer time required for saving/restoring register contents between a register and a main memory in a micro-processor is reduced, thereby performing register content save/restore processing at a high speed.

According to the present invention, the above object can be achieved mainly by improving a hardware arrangement of a register unit so that each register in an internal register unit of the micro-processor is constituted by a pair of cells. More specifically, each register has a pair of register cells as first and second cells having the same address. When one of the two cells is selected, the other cell serves as a back-up cell for the selected cell. Each register in the register unit includes a first flag which represents whether the first or second cell of the register is currently selected, and a second flag which represents whether register information of the register is rewritten after a selected cell is changed between the first and second cells of the register.

A register save/restore controller is connected to a register unit. When the first register information is to be written in a given register of the register unit, the controller selects one of the first and second cells of the register (at this time, the other cell remains as a nonselected cell) into which the first register information is stored. When the first register information is to be rewritten with the second register information, the controller selects the other cell and stores the second register information therein, thereby holding the first register information in one of the cells. Therefore, in this stage, the first register information need not be saved to the main memory. In addition, if the first register information is required after it is rewritten with the second register information, it can be rapidly restored to the corresponding register by only selecting the cell which stores the first register information, without performing save/restore processing between the register unit and the main memory.

The present invention and its objects and advantages will become more apparent in a detailed description of a preferred embodiment to be presented below.

BRIEF DESCRIPTION OF THE DRAWINGS

In the detailed description of a preferred embodiment of the invention presented below, reference is made to the accompanying drawings of which:

FIG. 2 is a schematic diagram showing changes in an execution mode flag which is controlled by the device for saving and restoring register information in FIG. 1 obtained when call mode and return mode events occur during a task performance procedure of a central processing unit; and FIGS. 3A, 3B, 3C, 4, 5A, 5B, 6A, 6B and 7 are schematic diagrams showing how stored contents of a given register of a register unit change when save/restore processing is performed in each of the call and return modes in correspondence to changes in selector and change flags provided in the register.

DETAILED DESCRIPTION OF THE PREFERRED EMBODIMENT

Figure 1:
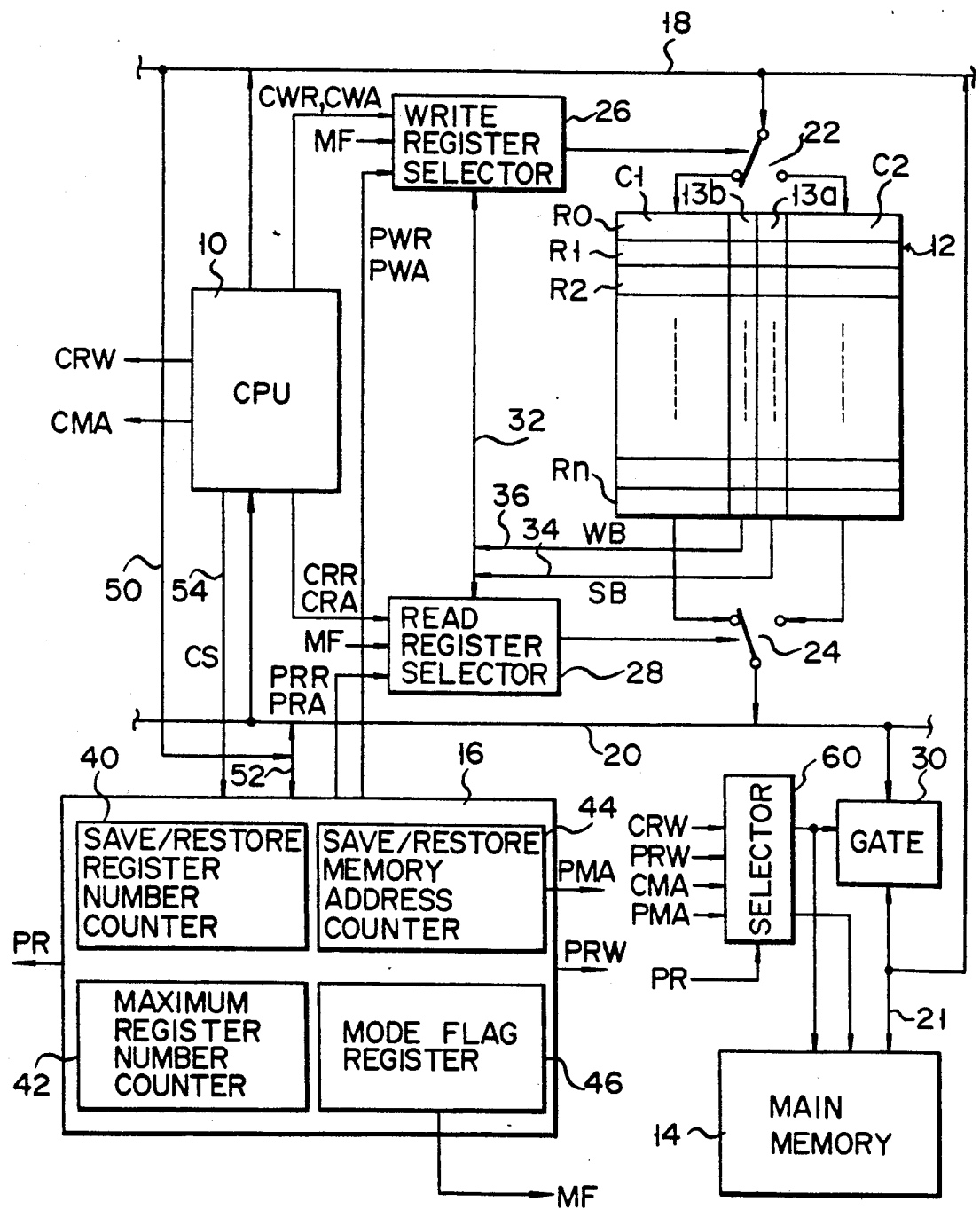
FIG. 1 is a block diagram showing an internal arrangement of a micro-processor incorporating a device for saving and restoring register information according to a preferred embodiment of the present invention.

Referring now to FIG. 1, a micro-processor has central processing unit (to be referred to as a "CPU" hereinafter) 10, internal register unit 12, main memory 14, and register save/restore controller 16 on its chip substrate (not shown). First data bus 18 serves as a data write bus for CPU 10 and register unit 12. Second data bus 20 functions as a data read bus for CPU 10 and register unit 12. CPU 10, register unit 12, and main memory 14 are connected to each other through buses 18 and 20. Therefore, under the control of controller 16, data transfer between register unit 12 and main memory 14 for saving/restoring register contents is performed through buses 18 and 20. Third data bus 21 allows data transfer between main memory 14 and the first and second data buses.

CPU 10 corresponds to a hardware arrangement of a general micro-processor without including a general-purpose register unit: CPU10 is constituted by an arithmetic and logical unit (abbreviated as an "ALU"), a timing and control unit, a program counter, an instruction register, an instruction decoding and machine cycle encoding unit, and the like.

Register unit 12 has an array of (n+1) registers R0, R1, R2, ..., Rn. As shown FIG. 1, each register Ri includes a pair of cells C1 and C2. Cell C1 is called as a "front cell" and cell C2 is called as a "back cell" hereinafter. Front and back cells C1 and C2 have the same address in a memory location of the register, and CPU 10 cannot discriminate the cells.

Each register Ri has flag storage bits 13a and 13b for respectively storing selector flag SB and change flag WB of cells C1 and C2. Selector flag SB is 1-bit binary data representing whether front or back cell C1 or C2 is currently selected in register Ri. Change flag WB is 1-bit binary data representing whether register information currently being used is changed to another new register information. In other words, change flag WB represents whether stored contents of a cell currently being selected are rewritten after the register cell is switched. Change flag WB is reset to have logic value "0" when an event occurs in a call mode such as a subroutine and software interruption and a return mode such as subroutine return and interruption return and a selected cell is changed between cells C1 and C2 of register Ri; and is set to have logic value "1" when the stored contents of the selected cell are rewritten with another information.

In other words, register unit 12 is constituted by parallel connection of an array of front cells C1 and that of back cells C2. However, register unit 12 is not a simple parallel connection of these two cell arrays. That is, bits 13a and 13b for storing flags SB and WB which represent current states of front and back cells C1 and C2 are provided for each pair of cells, and a selected cell can be independently switched in units of registers Ri. In other words, a back-up cell is additionally provided to each register address. When one of the two cells of register Ri is currently selected, the other cell serves as a "back-up cell" for the selected cell. This "back-up cell" is independently changed each time a selected cell is switched in register Ri. For example, when front cell C1 is selected in registers R0 and back cell C2 is selected in R1, back cell C2 and front cell C1 serve as "back-up cells" in registers R0 and R1, respectively. In register R1, when a selected cell is switched from back cell C2 to front cell C1, it can be assumed that back cell C2 which is a nonselected cell serves as a "back-up cell" for selected cell C1.

Data write bus 18 is connected to an input terminal of register unit 12 through first data flow controlling switch 22. Data read bus 20 is connected to an output terminal of register unit 12 through second data flow controlling switch 24. Switches 22 and 24 can arbitrarily perform switching between cells C1 and C2 of a desired register of register unit 12 independently of the remaining registers.

Switches 22 and 24 are connected to write register selector 26 and read register selector 28, respectively. When information to be written in register unit 12 is supplied, write register selector 26 appropriately controls switch 22 and sends the information to either of front and back cells C1 and C2 (which is determined by controller 16) at an address (i.e., a register) of a register memory location to be accessed. When contents (register stored information) of register unit 12 are to be temporarily saved to main memory 14 through bus 20, read register selector 28 appropriately controls switch 24. Therefore, one of cells C1 and C2 (which is designated by controller 16 and in which the information is stored) at an address (i.e., a register) of the register memory location to be accessed is connected to data read bus 20, so that the information is read out and transferred to main memory 14 through data bus 21 and gate circuit 30.

Write register selector 26 is connected to read register selector 28 through date bus 32. Stored contents of flag bits 13a and 13b of register Ri of register unit 12 are supplied through data lines 34 and 36. Execution mode flag MF is also supplied to selectors 26 and 28. Execution mode flag MF is 1-bit binary data which represents whether a call mode such as a subroutine call or interruption or a return mode such as subroutine return or interruption return of a software program algorithm is currently executed.

Write register selector 26 receives data write request CWR and data write address data (for designating an address of a register memory at which data is to be written) CWA from CPU 10. Selector 26 also receives data write request PWR and data write address data (for designating one of front and back cells C1 and C2 of the address of the register memory at which the data is to be written) PWA from controller 16. Selector 26 controls switch 22 so that one of cells C1 and C2 which is determined on the basis of change flags SB and WB of each cell, execution mode flag MF, and data CWR, CWA, PWR, and PWA supplied from CPU 10 and controller 16 is properly connected to data write bus 18.

Read register selector 28 receives data read request CRR and data read address data (for designating an address of a register memory from which data is to be read out) CRA from CPU 10. Selector 28 receives data read request PRR and data read address data (for designating one of front and back cells C1 and C2 at the address of the register memory from which the data is to be read out) PRA. Selector 28 controls switch 24 so that one of cells C1 and C2 which is determined on the basis of change flags SB and WB of each cell, execution mode flag MF, and data CRR, CRA, PRR, and PRA supplied from CPU 10 and controller 16 is properly connected to data write bus 20.

As shown in FIG. 1, register save/restore controller 16 is connected to CPU 10, data write bus 18, data read bus 20, write register selector 26, and read register selector 28. Controller 16 includes first, second, and third counters 40, 42, and 44. First counter 40 serves as a save/restore register number counter for designating a desired register to be saved/restored by in accordance with an address of the register. Second counter 42 serves as a maximum register number counter for counting a maximum register cell number for defining a maximum register memory amount which can be saved/restored at the same time in register unit 12. Third counter 44 serves as a save/restore register number counter for designating an address of a memory location of main memory 14 to which stored contents currently being stored in register unit 12 are saved or designating an address of the memory location of main memory 14 at which data to be restored to register unit 12 is stored. Controller 16 also includes a register (to be referred to as a "mode flag register" hereinafter) 46 for storing flag MF described above for specifying an operation mode (i.e., either of the call and return modes) currently being executed in the micro-processor.

When CPU 10 receives instructions such as a subroutine call or software interruption while executing software programs, controller 16 is set up as follows by CPU 10 through save/restore setup bus 50 connected to data write bus 18 and data bus 42:

(1) contents of counter 40 are reset to "0";
(2) contents of counter 42 are reset to the number of one or a plurality of registers to be saved of register unit 12;
(3) contents of counter 44 are set to a first address number of a memory area of main memory 14 in which stored contents of register unit 12 are to be saved; and
(4) contents of mode flag register 46 are set to "0" which represents the call mode (therefore, execution mode flag MF of logic value "0" is supplied to write and read register selectors 26 and 28). As a result, controller 16 saves register contents of register areas of register unit 12 from register address number "0" (i.e., register R0) to maximum register address number "n" (i.e., register Rn) to main memory 14 while sequentially updating a memory address counter value by "1". In this case, CPU status data CS is continuously supplied from CPU 10 to controller 16 through data bus 54. Data CS represents a current operation state of CPU 10. On the basis of data CS, controller 16 controls write and read register selectros 26 and 28 so that data is saved from register unit 12 to main memory 14 only in a cycle in which no data is transferred between CPU 10 and main memory 14 (i.e., a data transfer empty cycle which is known as an "empty memory bus cycle" to those skilled in the art). This empty memory bus cycle is set in CPU 10 when, for example:

CPU 10 is transferring operands between registers; and an instruction pre-fetching buffer is braked upon input of a jump instruction (in this case, an operation of CPU 10 is stopped until CPU 10 fetches a jump destination instruction).

When data saved to main memory 14 is returned (restored) to register unit 12, CPU 10 executes instructions such as subroutine return or interruption return, and controller 16 is set up as follows by CPU 10:

(1) contents of counter 40 are reset to "0";
(2) contents of counter 42 are reset to the number of one or a plurality of registers to be restored of register unit 12;
(3) contents of counter 44 are set to a first address number of a memory area of main memory 14 in which data to be restored of register unit 12 is stored; and
(4) contents of mode flag register 46 are set to "1" which represents the return mode (therefore, execution mode flag MF of logic value "1" is supplied to write and read register selectors 26 and 28). As a result, controller 16 transfers the data to be restored of register areas of register unit 12 from register address number "0" (i.e., register R0) to maximum register address number "n" (i.e., register Rn) to main memory 14 while sequentially updating a memory address counter value by "1". In this case, CPU status data CS is continuously supplied from CPU 10 to controller 16 through data bus 54. Data CS represents a current operation state of CPU 10. On the basis of data CS, controller 16 controls write and read register selectors 26 and 28 so that data is restored from main memory 14 to register unit 12 only in an empty memory bus cycle.

Data to be written in main memory 14 is transferred to main memory 14 through data write bus 18. Data read out from main memory 14 is supplied to register unit 12 through data read bus 20. Gate circuit 30 is provided between main memory 14 and bus 20. Gate circuit 30 opens to connect main memory 14 to bus 20 when stored contents of register unit 12 are to be saved to main memory 14; and closes to connect main memory 14 to bus 18 when stored data of main memory 14 is restored to register unit 12.

Gate circuit 30 is connected to selector 60. Selector 60 selects either memory read/write signal CRW which is generated by CPU 10 or memory read/write signal PRW which is generated by controller 16, and transfers the selected signal to gate circuit 30 and main memory 14 in response to save/restore request signal PR from controller 16. Selector 60 also selects either memory address data CMA which is prepared by CPU 10 or memory address data PMA which is prepared by controller 16, and supplies the selected data to gate circuit 30 and main memory 14 in response to save/restore request signal PR.

In the circuit arrangement described above, one of most important characteristics is such that each register of register unit 12 is constituted by a pair of front and back cells C1 and C2 in the same address. This register cell arrangement is essential to save/restore data between register unit 12 and main memory 14 independently of soft program execution cycles of CPU 10 and utilizing empty time intervals between the execution cycles. That is, while a given process is executed by CPU 10 using front cell C1, register information for another process is allowed to be protected in back cell C2. As a result, old register information need not be saved to main memory 14 when these processes are switched. If three or more of processes are to be executed, stored contents of one of two cells C1 and C2 currently not being selected are saved to main memory 14 or restored therefrom in each register. Therefore, stored content save/restore processing for register unit 12 does not directly conflict with the process currently being executed by CPU 10. In addition, of two cells C1 and C2 of each register, the remaining cell (e.g., C2) other than the cell (e.g., C1) currently being selected serves as a "back-up cell" for the currently selected cell (e.g., C1). Therefore, when a currently executed process to be executed by CPU 10 is switched to another new process, information for the current process can be kept stored (backed up) in the remaining cell (e.g., C2) other than the currently selected cell (e.g., C1). Therefore, when the information is required again thereafter, (e.g., when register data is referred to with respect to subroutine processing or when an operation must be returned to an information environment one step before the present, i.e., a choice point one level before the present during execution of identification processing of data and list information in a PROLOG machine, etc.), the backed-up register information for the preceding process can be rapidly supplied to CPU 10.

In order to effectively realize the above function, according to the device for saving and restoring register information of the present invention, selector flag SB and change flag WB are provided to each register in register unit 12. In addition, selection between a pair of cells C1 and C2 which constitute each register of register unit 12 is performed by a switching operation of switches 22 and 24 which are controlled by register selectors 26 and 28 in response to execution flag MF controlled by controller 16.

Execution mode flag MF discriminates the call mode such as a subroutine call or interruption generation from the return mode such as subroutine return or interruption return. FIG. 2 shows a diagram schematically showing how a process executed by CPU 10 is processed by repeating the call and return modes, wherein a plurality of thick white vertical lines represent execution of processing such as instruction execution of a process and thin oblique lines connecting the thick white lines represent execution of a process call or process return (i.e., process switching). In FIG. 2, a process represented by "process 2" is a subprocess which interrupts execution of "process 1" (to be referred to as a "main process" hereinafter) as shown by broken line 70 in FIG. 2.

At a start of the main process (process 1), execution mode flag MF is initialized to logic value "0". This means that the main process starts from the call mode. When an instruction such as a subroutine, interruption, or the like is executed (i.e., when the call mode is set) in a given process, i.e., when a process to be executed is changed from the left to right process in FIG. 2, execution mode flag MF has logic value "0". Therefore, if a plurality of call modes are successively set, execution mode flag MF holds logic value "0". When an instruction such as subroutine return, interruption return, or the like is executed (i.e., when the return mode is set) in the process, i.e., when a process to be executed is returned from the right to left process in FIG. 2, execution mode flag MF has logic value "1". Therefore, if a plurality of the return modes are successively set, execution mode flag MF holds logic value "1". When the above event occurs, change flag WB is reset to have a logic value "0". Meanings of the three main flags are summarized in the following table.

|  | Logic Value "0" | Logic Value "1" |
| --- | --- | --- |
| Selector Flag SB | Cell C1 Is Selected | Cell C2 Is Selected |
| Change Flag WB | Register Contents Are Not Rewritten (Flag Is Reset When Event Occurs And Selected Cell Is Changed) | Register Contents Are Rewritten (New Information Is Written In New Selected Cell And Register Contents Before Event Are Protected In Back-up Cell) |
| Execution Mode Flag MF | CPU 10 Is In Call Mode | CPU 10 Is In Return Mode |

An operation (algorithm) of the device for saving and restoring register information having the above arrangement according to the present invention will be described in detail below. The operation will be described with reference to two states having different logic values of execution mode flag MF which is controlled by save/restore controller 16, i.e., with reference to the call mode and the return mode of CPU 10.

Call Mode

When CPU 10 encounters as event such as a subroutine or interruption while executing a given process, i.e., when CPU 10 executes an instruction in the call mode, register contents (register information) for defining an information environment of the process currently being executed must be saved to a "back-up cell" of a corresponding register of register unit 12 or to a proper address of a memory location of main memory 14. In this case, register accessing by CPU 10 is performed as follows.

FIG. 3A shows register Ri which is one of registers of register unit 12, wherein, for example, selector flag SB has logic value "1" (therefore, back cell C2 is selected) and change flag WB has logic value "0". At this time, switch 24 is switched as shown in FIG. 3A under the control of read register selector 28, and back cell C2 is connected to data read bus 20. Therefore, current process information stored in cell C2 are read out as represented by arrow 80. That is, the register data is always read out firstly from a selected cell (in this case, cell C2) of the two cells of register Ri.

Information is written in register Ri in two ways in accordance with a logic value of change flag WB. That is, when selector flag SB has logic value "0" and change flag WB has logic value "0", selector flag SB is inverted to have logic value "1", and switch 22 is switched under the control of write register selector 26 to write the information in a cell represented by inverted selector flag SB, i.e., in this case, cell C1. At this time, change flag WB is set to have logic value "1" as indicated by arrow 84. Therefore, the information is written in cell C2 as indicated by arrow 86. On the other hand, when change flag WB has logic value "1", selector flag SB is not inverted, and switch 22 is switched to write the information in a cell designated by selector flag SB having logic value "1", i.e., cell C2, as shown in FIG. 3C. At this time, change flag WB holds logic value "1".

By performing the above register reading/writing operation, after CPU 10 completes processing such as subroutine or interruption, register information stored before the processing is performed can be immediately accessed.

It should be noted that, since change flag WB is automatically reset to logic value "0" when an event such as a subroutine call is executed, the first register writing operation in the subroutine (or interruption) is performed under the condition that change flag WB=0. In this case, as shown in FIG. 4, selector flag SB is inverted, and information "Y" to be written is stored in a register cell which is designated by inverted selector flag SB as indicated by arrow 88 of FIG. 4. At this time, change flag WB is set to logic value "1". By this procedure, while the register cell information stored in one cell (in this case, front cell C1 as shown in FIG. 4) of the register of register unit 12 before occurrence of the event is held therein (i.e., cell C1), new information to be written can be stored in the other cell (i.e., back cell C2) of the register. In other words, when an event such as a subroutine call occurs for the first time in the call mode of CPU 10, register information stored in a cell immediately before occurrence of the event is not erased but is successively held therein, and the other cell (which serves as a "back-up cell") of the register is selected so that the new information is written therein. Therefore, since the register cell information stored immediately before occurrence of the event need not be saved to main memory 14, an environment of the register information concerning processing of the event can be rapidly changed.

A data read algorithm of a register according to register saving in the call mode will be described below. When an event such as a subroutine call occurs while CPU 10 executes a given process, CPU 10 performs set-up processing of controller 16 as described above so as to save register contents relating to the above process executed immediately before occurrence of the event to a suitable address of the memory location of main memory 14. The register information to be saved is read out from register unit 12 in two ways in accordance with a logic value of change flag WB of corresponding register Ri. When change flag WB has logic value "0" (see FIG. 5A), i.e., when stored contents of a cell currently being selected are not rewritten (in this case, register contents in a cell at the subroutine side are not rewritten), information stored in a cell designated by selector flag SB is read out. In FIG. 5A, since selector flag SB has logic value "0", contents "X" of front cell C1 are read out as indicated by arrow 90. When change flag WB has logic value "1" (see FIG. 5B), i.e., when stored contents of a cell currently being selected are rewritten, information stored in a cell opposite to a cell designated by selector flag SB is read out. This is because, in this case, the register contents in the cell at the subroutine side are rewritten and therefore information to be saved is present in the other cell (i.e., a "back-up cell"). In FIG. 5B, since selector flag SB has logic value "1", contents "Y" of front cell C1 are read out as indicated by arrow 92.

Assume that in the call mode, an event such as another subroutine call, subroutine return, and interruption occurs before stored contents of a necessary number of registers of register unit 12 are saved to main memory 14. In this case, occurrence of the above event can be detected by monitoring information on monitor bus 52 shown in FIG. 1. When the event such as a subroutine call or interruption occurs, execution of this event is temporarily delayed, and saving processing of the above register contents is executed prior to execution of the event. This is to prevent destruction of register information to be saved when information of the event is stored in register unit 12. On the contrary, when the event is subroutine return, the register content saving processing is immediately stopped (interrupted), and the event is executed prior to the processing. This is because, in this case, the previous register information required for executing the above subroutine return is stored not in a currently selected cell but in the other cell serving as a "back-up cell" for the currently selected cell of two cells in each of the corresponding registers.

Return Mode

When CPU 10 encounters an event such as subroutine return while executing a given process, i.e., when CPU 10 executes an instruction in a return mode, register information for defining an information environment of the preceding process which is saved to main memory 14 must be restored to register unit 12. In this state, CPU 10 performs register accessing as follows.

Register read in the return mode is performed such that a cell designated by selector flag SB of register Ri is subjected to a reading operation, as in the call mode. That is, in FIG. 6A, for example, since selector flag SB has logic value "1", back cell C2 is currently selected. Therefore, register information of cell C2 is read out as indicated by arrow 94.

Information write into register Ri is performed with respect to a cell designated by selector flag SB in the same manner as described above. In FIG. 6B, for example, since selector flag SB has logic value "1", switch 22 is switched so that information to be written is supplied to cell C2 as indicated by arrow 96. In this case, a logic value of change flag WB is not changed (set up).

In the return mode, in order to prepare for another subroutine return which is expected to occur next to the return event currently being executed, register information restoring processing must be performed to a nonselected cell other than the currently selected cell. In order to perform this processing, after CPU 10 executes one subroutine, it sets up change flag WB of corresponding register Ri to prepare for the next return event. For example, according to FIG. 7, a logic value of change flag WB is changed from "0" to "1". Therefore, each time an empty cycle is generated in data transfer bus 18 or 20 of CPU 10 (this empty cycle is generated when, e.g., (a) CPU 10 executes a data transfer instruction between registers, (b) an instruction pre-read register is invalidated or valve-broken while a jump instruction is executed, and (c) an instruction cache memory is provided and a desired instruction is not hit in the cache memory), register information to be restored is read out from main memory 14 and is written in a corresponding non-selected cell (i.e., a cell opposite to the cell currently being designated by selector flag SB and serves as a "back-up cell") of register unit 12. In FIG. 7, since selector flag SB has logic value "1", the register information to be restored is written in cell C1 opposite to cell C2 which is designated by selector flag SB as indicated by arrow 98. When this information write is completed, a logic value of change flag WB is changed from "0" to "1" as indicated by arrow 100.

When CPU 10 executes an instruction of the next subroutine return after restore processing of the register information is completed, selector flags SB of registers whose change flags WB have logic values "1" of register unit 12 are automatically inverted. At this time, change flags WB having logic values "1" are all reset to logic value "0". As a result, all change flags WB have logic values "0". Therefore, in this state, selector flag SB in register Ri represents a cell in which the register information is restored.

Assume that in the return mode, an event such as another subroutine call, subroutine return, or interruption occurs before register information is completely restored to a necessary number of registers of register unit 12. In this case, if a call mode event such as a subroutine call or interruption occurs, the register restore processing is immediately stopped (interrupted), and the event is executed prior to the processing. On the contrary, if the event is a subroutine return, execution of the event is temporarily delayed, and register content save processing is executed prior to the event.

According to the device for saving and restoring register information, a pair of register cells C1 and C2 having the same register address is provided to each register of register unit 12. Therefore, when register contents of register Ri are to be changed, an amount of information transfer for saving/restoring between register unit 12 and main memory 14 can be reduced. As a result, save/restore processing of register unit 12 can be efficiently performed.

More specifically, register contents of register Ri of register unit 12 must be rewritten with another new information in various kinds of events, such as process switching of a micro-processor adapted to a specific operation system, identification processing of a microprocessor specified to a PROLOG machine, or various events such as a subroutine call, interruption, subroutine return, and interruption return which occur during execution of a software program. In such a case, the above new information is written in a register cell (e.g., cell C2) other than a register cell (e.g., cell C1) currently being selected using selector flag SB and change flag WB provided to register Ri and execution mode flag MF controlled by save/restore controller 16. At this time, cell C2 stores the new information as a newly selected cell, and the old register information is kept protected in cell C1 serving as a "back-up cell". Since the old register information is still present in register unit 12 in register content change of one level as described above, save processing to main memory 14 need not be performed for register Ri. When the old register information is required again, this information can be restored in register Ri by only selecting "back-up cell" C2 again. This back-up protection of information is performed independently of other registers in units of registers in register unit 12. Therefore, when register contents of register unit 12 are to be partially changed frequently, register unit 12 can be accessed at a high speed.

Register information of register Ri must be saved to main memory 14 only when still another information must be subsequently written in register Ri (i.e., register content change of two levels or more). Since this save processing (although restore processing is similar to the save processing) is performed utilizing empty cycles of CPU 10 (this cycle is essentially a useless time for CPU 10), a processing speed of CPU 10 is not basically reduced. Actually, according to experiments conducted by the present inventors, it is confirmed that the empty cycles are generated so frequently as to cancel a time required for register saving/restoring. Therefore, in this case, a time consumed for register saving/restoring is actually zero.

The above characteristics greatly contribute to save/restore register contents of register unit 12 in process switching, identification processing of a PROLOG machine, various events which occur during execution of a software program within minimum reduced time at a high speed. Therefore, the above characteristics are very important because an actual operation speed of a micro-processor can be improved without changing any basic specifications. In addition, old register information one level before register information currently being used is kept stored in register unit 12. Therefore, an information environment one level before the present can be immediately activated as needed in, e.g., the PROLOG machine, thereby increasing a processing speed of an artificial intelligence task.

Furthermore, according to the present invention, since selector flag SB and change flag WB are provided to each register, the states of two cells C1 and C2 of a designated register can be clearly recognized. Therefore, when register contents are to be changed or register saving/storing is to be executed, processing for determining which cell of cells C1 and C2 of register Ri is to be accessed can be properly and accurately executed on the basis of selector flag SB, change flag WB, and execution mode flag MF which is controlled by save/restore controller 16. This characteristic contributes to maintain consistency of register cell accessing of register unit 12.

What is claimed is:

1. A register device for a central processing unit, comprising:

a register unit having first and second resister sections each of which has an array of a preselected number of register cells, each cell of said first register section being combined with a corresponding cell of said second register section to define a register cell pair, one cell of said register cell pair serving as a backup cell while the other of said register cell pair is being currently selected;

first flag holding means, provided for each of the register cell pairs of said register unit, for holding therein a first flag representing which cell of a certain cell pair is being currently selected to store register information independently of the remaining cell pairs of said register unit;

second flag holding means, provided for each cell pair, for holding therein a second flag representing whether the register information is rewritten after the selected cell is changed between the register cells in the certain cell pair independently of the remaining cell pairs of said register unit; and controller means, connected to said register unit, said first flag holding means, and said second flag holding means, for, when first register information is to be written in a given register cell pair of said register unit, selecting one of the register cells thereof into which the first register information is stored, wherein, the other cell of the given cell pair remains as a non-selected cell, and for, when the first register information is to be rewritten with second register information in said given cell pair, designating said other cell as a new selected cell and storing the second register information therein and at the same time holding the first register information in said one cell, whereby the first register information is protectedly maintained within said register unit after the first register information is rewritten with the second register information.

2. The device according to claim 1, wherein said controller means comprises,
   switching means connected to said register unit, for the independent switching of the selected cell in each of the register cell paris, and for supplying an information transfer path to a cell currently selected in each cell pair of said register unit.

3. The device according to claim 2, further comprising a main memory, and wherein third register information is to be written in said register unit instead of the second register information, said controller means
   detects a cell of said register cell pair being currently selected and a storage state thereof on the basis of said first flag and second flag,
   saves the first register information which is held in said one cell currently serving as a non-selected, backup call to said main memory,
   switches the selected cell in said register cell pair to select said one cell again, and
   stores the third register information in said one cell thus selected, the second register information being held in said other cell which is not selected.

4. The device according to claim 3, wherein said first flag has a binary bit which is changed each time the selected cell is switched in a corresponding register cell pair, whereas said second flag has a binary bit which is changed when information being currently used in said register cell pair is changed from the first register information to the second register information.

5. An information processing device comprising:
   a central processing unit;
   a main memory;
   a register unit having a plurality of pairs of register cells each pair of which consists of a first cell and a second cell assigned with the same register address,
   switch means connected with said register unit, for allowing each pair of the register cells to be designated independently of the remaining pairs of said register unit and for enabling one of the first and second cells of each register cell pair thus designated to be alternately selected and accessed;
   first flag storage portions which are associated with the register cell pairs respectively, and each of which stores a selector flag of binary bit data representing which cell of said first and second cells of a corresponding register cell pair is being currently selected;
   second flag storage portions which are associated with the register cell pairs respectively, and each of which stores a change flag of binary data representing whether information stored in a selected cell is rewritten with new information in a corresponding register cell pair;
   register controller means, connected to said central processing unit; said main memory, said register unit, said first flag storage Portions, and second flag storage portions, for, when first register information of the first register cell which is designated by the selector flag as a selected cell in a given register cell pair is rewritten by second register information;
   means for inverting the selector flag so that the selected cell in said given cell pair is switched to the second register cell independently of the remaining register cell pairs of said register unit;
   means for storing the second information into the second register cell of said given cell pair while allowing the first information to be being held in the first register cell which is being designated as a non-selected cell in said given cell pair, thereby eliminating necessity of saving the first information to said main memory; and
   means for rendering the change flag kept unchanged; and
   such that said register controller means inverts the selector flag so as to designate again the first register cell in said given cell pair when the second information is required to be written by third register information;
   means for transferring the first information being stored in the first register call of said given cell pair to said main memory, which then stores therein said first information,
   means for storing the third information into the first register cell of said given cell pair, said third information being allowed to be accessed by said central processing unit, and
   means for inverting said change flag of said given cell pair.

6. The device according to claim 5, wherein, when the first information is again requested by said central processing unit after the second information is stored in said given cell pair and before the third information is stored in said given cell pair, said register controller means restores the first information by inverting the selector flag so that the selected cell in said given cell pair is switched from the second register cell to the first register cell independently of the remaining register cell pairs of said register unit.

7. The device according to claim 6, wherein, when the first information is again requested by said central processing unit after the first information is stored in said main memory, said register controller means comprises:
   means to invert the selector flag of said given cell pair so as to designate the second register cell as the selected cell wherein; and
   means to restore the first information being stored in said main memory in said second register cell.

8. The device according to claim 6, wherein said register controller means operates in empty operating cycles of said central processing unit.

9. The device according to claim 6, wherein said register controller means comprises:
   first counter means for designating a desired register pair to be subjected to save/restore processing on the basis of the register address;
   second counter means for counting a maximum register cell number for defining a maximal register memory amount which can be saved/restored simultaneously in said register unit; and third counter means for designating an address of a memory location of said main memory into which the first information being stored in said given call pair of said register unit is to be stored.

10. The device according to claim 9, wherein said register controller means comprises:
    additional flag storage means for storing an execution mode flag which represents an execution mode being currently carried out in said central processing unit.

11. An information processing device comprising:
a central processing unit;
a main memory;
a register unit having a plurality of pairs of register cells each pair of which consists of a first cell and a second cell assigned with the same register address,
switch means connected with said register unit, for allowing each pair of the register cells to be designated independently of the remaining pairs of said register unit and for enabling one of the first and second cells of each register cell pair thus designated to be alternately selected;
first flag storage portions which are associated with the register cell pairs respectively, and each of which stores a selector flag of binary bit data representing which cell of said first and second cells of a corresponding register cell pair is being currently selected;
second flag storage portions which are associated with the register cell pairs respectively, and each of which stores a change flag of binary data representing whether information stored in a selected cell is rewritten with new information in a corresponding register cell pair;
register controller means, connected to said central processing unit, said main memory, said register unit, said first flag storage portions, and second flag storage Portions, for, when first register information of the first register cell which is designated by the selector flag as a selected cell in a given register cell pair is rewritten by second register information;
means for inverting the selector flag so that the selected cell in said given cell pair is switched to the second register cell independently of the remaining register cell pairs of said register unit;
wherein said register controller means has means for storing the second information into the second register cell of said given cell pair while allowing the first information to be being held in the first register cell which is being designated as a non-selected cell in said given cell pair, thereby eliminating necessity of saving the first information to said main memory, and
rendering the change flag unchanged.

12. The device according to claim 11, wherein said register controller means comprises:
first counter means for designating a desired register pair to be subjected to save/restore processing on the basis of the register address,
second counter means for counting a maximum register cell number for defining a maximal register memory amount which can be saved/restored simultaneously in said register unit; and
third counter means for designating an address of a memory location of said main memory into which the first information being stored in said given call pair of said register unit is to be stored.

13. The device according to claim 12, wherein said register controller means comprises:
additional flag storage means for storing an execution mode flag which represents an execution mode being currently carried out in said central processing unit.

14. The device according to claim 13, wherein said register controller means further comprises:
means to invert the selector flag so as to designate again the first register cell in said given cell pair when the second information is required to be rewritten by third register information;
means to transfer the first information being stored in the first register cell of said given cell pair to said main memory, which then stores therein said first information;
means to store the third information into the first register cell of said given cell pair, said third information being allowed to be accessed by said central processing unit; and
means to invert said change flag of said given cell pair.

15. The device according to claim 14, wherein said register controller means operates in empty operating cycles of said central processing unit.

16. The device according to claim 15, wherein, when the first information is again requested by said central processing unit after the second information is stored in said given cell pair and before the third information is stored in said given cell pair, said register controller means restores the first information by inverting the selector flag so that the selected cell in said given cell pair is switched from the second register cell to the first register cell independently of the remaining register cell pairs of said register unit.

17. The device according to claim 16, wherein, when the first information is again requested by said central processing unit after the first information is stored in said main memory, said register controller means comprises:
means to invert the selector flag of said given cell pair so as to designate the second register cell as the selected cell therein, and
means to restore the first information being stored in said main memory in said second register cell.

* * * * *